United States Patent [19]

Atherton

[11] 4,406,957
[45] Sep. 27, 1983

[54] INPUT BUFFER CIRCUIT

[75] Inventor: James H. Atherton, Freeport, Ill.

[73] Assignee: RCA Corporation, New York, N.Y.

[21] Appl. No.: 313,943

[22] Filed: Oct. 22, 1981

[51] Int. Cl.³ .............. H03K 19/094; H03K 19/092; H03K 19/017

[52] U.S. Cl. .................. 307/475; 307/264; 307/568

[58] Field of Search .......... 307/264, 304, 451, 469, 307/475, 546, 555, 568

[56] References Cited

U.S. PATENT DOCUMENTS

| | | |
|---|---|---|
| 3,676,700 | 7/1972 | Buchanan. |
| 3,728,556 | 4/1973 | Arnell. |
| 3,739,194 | 6/1973 | Freeman et al.. |
| 3,755,690 | 8/1973 | Smith. |
| 3,801,831 | 4/1974 | Dame. |
| 3,823,330 | 7/1974 | Rapp .................. 307/475 |
| 3,832,574 | 8/1974 | Leehan. |
| 3,835,457 | 9/1974 | Yu. |
| 3,906,254 | 9/1975 | Lane et al.. |
| 4,039,862 | 8/1977 | Dingwall et al.. |
| 4,080,539 | 3/1978 | Stewart. |
| 4,096,398 | 6/1978 | Khaitan .................. 307/475 |
| 4,216,390 | 8/1980 | Stewart. |
| 4,256,974 | 3/1981 | Padgett et al.. |
| 4,258,272 | 3/1981 | Huang .................. 307/475 |
| 4,268,761 | 5/1981 | Suzuki et al.. |
| 4,342,928 | 8/1982 | Gschwendtner et al. .......... 307/475 |

Primary Examiner—John Zazworsky
Attorney, Agent, or Firm—Joseph S. Tripoli; Henry I. Schanzer

[57] ABSTRACT

A first insulated-gate field-effect transistor (IGFET) having its conduction path connected between a first power terminal and an output terminal and a second IGFET of complementary conductivity to said first IGFET connected between the output terminal and a second power terminal. A selectively enabled level shift means coupled between the gate electrodes of the first and second IGFETs functions to substantially reduce the turn-on potential across the first transistor and to drive it off or to a high impedance state when a turn-on signal is applied to the second IGFET. The second IGFET can then easily and quickly drive the output to the voltage at the second power terminal. In response to an input turn-on signal for the first IGFET, it is pulsed on momentarily and the output is then clamped to the potential at the first power terminal.

6 Claims, 3 Drawing Figures

INPUT BUFFER CIRCUIT

This invention relates to an interface circuit operable as a level shift circuit.

The invention is best understood by reference to the accompanying drawing in which like reference characters denote like components and in which.

It is often necessary and/or desirable to operate different parts of an electronic system at different voltage levels. At the places where the different parts interface, they must be coupled to each other. However, the signals at the interfaces are not necessarily compatible. It is, therefore, necessary to provide interface and level shift circuits which can render one part of the system compatible with the other. For an interface or level shift circuit to be useful, it must be compatible with the other circuits of the system with respect, among other things, to speed of operation, and minimization of power dissipation.

Figure 1A:
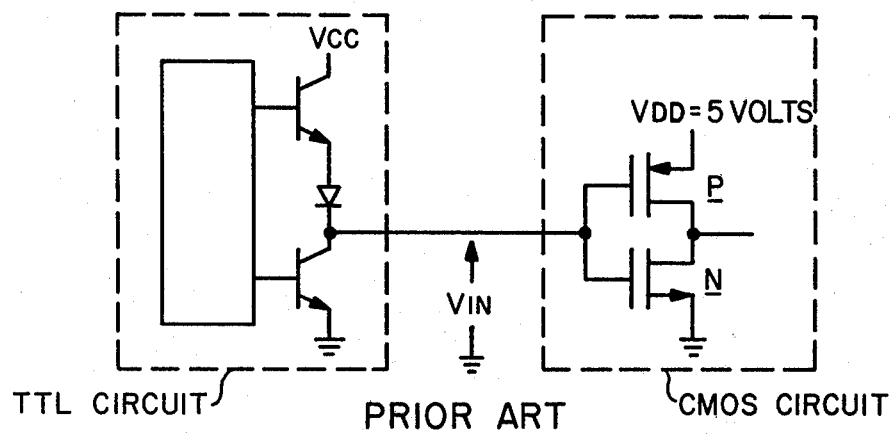
FIG. 1A is a schematic diagram of a prior art circuit.
Figure 1B:
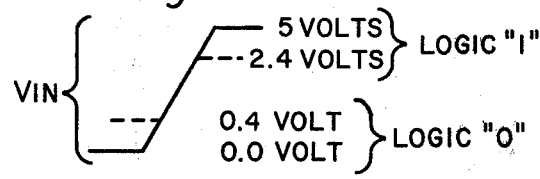
FIG. 1B is a diagram of typical logic levels produced by a transistor transistor logic (TTL) circuit.

By way of example, a problem which exists in interfacing the output signal of a transistor transistor logic (TTL) circuit to the input of a complementary metal oxide semiconductor (CMOS) circuit is best illustrated by reference to FIG. 1A. The logic "1" or "high" level output of the TTL signal denoted as $V_{IN}$ ranges, as shown in FIG. 1B, from approximately 2.4 volts to 5 volts, and the logic "0" or "low" level ranges from 0 volts to 0.4 volt. The worst case condition for distinguishing between the "high" and "low" TTL output levels may be defined as 2.4 volts for the "high" level and 0.4 volt for the "low" level. In CMOS circuits it is conventional to have an input buffer comprised of series connected P-channel and N-channel insulated-gate field-effect transistors (IGFETs) forming a "complementary inverter". Where the operating voltage ($V_{DD}$) to the CMOS circuit is, for example, 5 volts, the desired logic "1" and "0" signal should be close to 5 volts and 0 volts, respectively, to ensure that when one of the two IGFETs is turned-on the other one is turned-off. However, where the "highest" $V_{IN}$ is 2.4 volts a problem exists because both the P and the N channel are turned-on simultaneously resulting in a relatively low impedance path between $V_{DD}$ and ground and an unacceptably high power dissipation level. In addition, the output level is undefined, being somewhere between $V_{DD}$ and ground. To avoid these problems and to assure stable switching states at the 0.4 volt and 2.4 volts input levels, the prior art teaches making the impedance of the P-channel IGFET much larger (typically at least 10 times greater) than the impedance of the N-channel IGFET when both are conducting; i.e., the size of the N-IGFET is made much larger than that of the P-IGFET. The large "skew" of the input inverter enables the output to be defined for TTL inputs but leads to many other problems.

First, for full rail-to-rail input signals (0–5 volts) where skewing of the input buffer is not required, the response of the input buffer is rendered highly asymmetrical. The very small drive capability of the P-IGFET (compared to the N-IGFET) results in greatly increased delays for input signal transitions of one polarity (e.g. 2.4 volt to 0.4 volt) compared to those of opposite polarity. The circuit response is therefore delayed in one direction and the circuit operation is severely degraded.

Another problem is the high power dissipation of the inverter in response to TTL level inputs. A major advantage of CMOS technology is its extremely low standby power dissipation, (e.g. microwatts). However, the low power dissipation is specified only with full rail-to-rail CMOS input levels. The static power with TTL levels can be orders of magnitude higher—in the milliwatt range. Increasing the impedance of the P and N channel devices decreases the power dissipation but is not tolerable in high speed circuits, since the impedance of the P devices would have to be made so much larger than that of the N device. On the other hand, increasing the size of the devices (decreasing their impedance) reduces delays but aggravates the power dissipation problem. Also, the requirement for a large geometry N-IGFET compared to the P-IGFET presents problems in the layout and fabrication of the circuit.

In short, a problem exists where a complementary inverter operated, for example, between 0 and 5 volts must, in response to signals varying, for example, between 0.4 and 2.4 volts, be capable of producing, with very little delay and in a generally symmetrical fashion, output signals close to 0 or 5 volts and do so without significant power dissipation.

In circuits embodying the invention, the conduction path of a first IGFET of first conductivity type is connected between a first power terminal and an output terminal and the conduction path of a second IGFET of second conductivity type is connected between the output terminal and a second power terminal. Selectively enabled level shift means coupled between the control electrodes of the first and second IGFETs functions to substantially reduce the turn-on potential across the first transistor and to drive it off or to a high impedance state when a turn-on signal is applied to the second IGFEt driving the voltage at the output terminal to the voltage at the second power terminal. In response to an input signal of a polarity and magnitude to turn-on the first IGFET, the first IGFET is pulsed-on momentarily and the output terminal is then clamped to the potential at the first power terminal.

Figure 2:
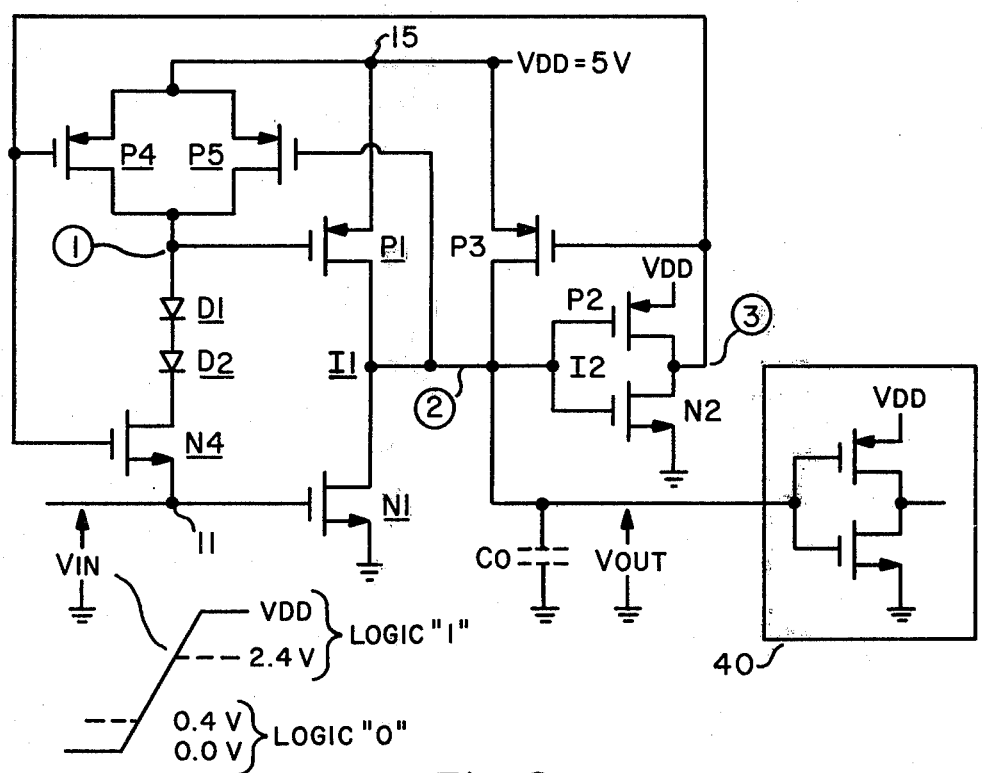
FIG. 2 is a schematic diagram of a circuit embodying the invention.

The circuit of FIG. 2 includes an input terminal 11 to which is applied an input signal $V_{IN}$ from a TTL source (not shown). $V_{IN}$ may vary as shown in the FIGURE from a "low" condition which ranges between 0 volt and 0.4 volt and a "high" condition which ranges between 2.4 volts and $V_{DD}$ volts, which, in this application, is assumed equal to +5 volts.

The input buffer I1 is comprised of IGFETs P1 and N1. The gate electrode of N1 is connected to terminal 11 and its source electrode is returned to ground. The gate electrode of P1 is connected to node 1 and its source electrode is connected to terminal 15 to which is applied $V_{DD}$ volts. Node 1 is connected to input terminal 11 via the series connection of diodes D1 and D2 and the conduction path of an IGFET N4. The drains of P1 and N1 are connected to output node 2 to which is connected output load 40 which includes the gate electrodes of one or more IGFETs. The loading on node 2 is a high impedance, primarily capacitive load. Capacitor $C_O$ represents the total capacitance associated with node 2.

The conduction paths of two IGFETs, P4 and P5, are connected in parallel between node 1 and power terminal 15. The gate electrode of P5 is connected to output node 2. P5 is a high impedance (small geometry) device which, as described below, is designed to allow the passage of sufficient current through diodes D1 and D2 to ensure that they function to level shift the voltage level between input terminal 11 and node 1.

A complementary inverter I2 is connected at its input to node 2 and at its output, defined as node 3, to the gate electrodes of IGFETs P3, P4 and N4. The conduction path of P3 is connected between terminal 15 and node 2, whereby P3 functions to clamp node 2 to $V_{DD}$ when the output of I2 goes low.

Inverter I2 is shown to be a complementary inverter but could be, instead, any one of a known number of high input impedance inverters.

The operation of the circuit of FIG. 2 will be examined for the condition when the input signal ($V_{IN}$) is "low" (between 0 volt and 0.4 volt), then for the condition when $V_{IN}$ makes a transition from low to "high" (a minimum of 2.4 volts), then for the condition when $V_{IN}$ is high, and finally for the condition when $V_{IN}$ makes a transition from high to low.

(a) When $V_{IN}$ is at or below 0.4 volt, N1 is turned-off, node 2 goes high and P2 is turned-off. N2 is turned-on clamping node 3 to ground. This turns-on P3 holding node 2 at $V_{DD}$ and P2 off. Concurrently, when node 3 goes to ground, P4 is turned-on clamping node 1 to $V_{DD}$ which turns-off P1, and N4 is turned-off, effectively decoupling the gate of P1 from input terminal 11.

(b) When $V_{IN}$ makes a transition from the "low" level to 2.4 volts, transistor N1 turns-on. Since P1 is turned-off and since P3 is designed to have a greater impedance than N1 under like bias conditions, N1 can easily and quickly drive node 2 to ground. The low at node 2 turns-on P2 and turns-off N2 driving node 3 to $V_{DD}$ volts. The low at node 2 also turns-on P5 which provides a high impedance conduction path between terminal 15 and the level shift network connected to node 1. With $V_{DD}$ at node 3, P3 and P4 are turned-off and N4 is turned-on. N4 with its source at 2.4 volts and its gate at 5 volts is turned-on and couples node 1 to input terminal 11 via diodes D1 and D2 and its own conduction path. P5 is a high impedance small geometry device which supplies a small bias current for diodes D1 and D2, so that the diodes function to level shift the signal level between input terminal 11 and node 1.

With $V_{IN}$ at 2.4 volts, the voltage level at node 1 will be equal to at least 2.4 volts plus $2 \times V_F$ volts, where $V_F$ is the forward voltage drop of diodes D1 and D2. Assume, by way of example, that the forward voltage drop ($V_F$) of each diode (D1 and D2) is 0.8 volt. The voltage developed at node 1 for a $V_{IN}$ of 2.4 volts will then be 4 volts. Assume further that the threshold voltage ($V_T$) of P1 is 1 volt. The gate to source potential ($V_{GS}$) of P1 will then be 1 volt. Since the $V_T$ of P1 is also 1 volt, P1 will either be turned-off or, if turned-on, will only be so to a very slight extent, and the source-to-drain path of P1 appears as a high impedance. Thus, when $V_{IN}$ goes to 2.4 volts, output node 2 is quickly driven to ground via the conduction path of N1 and it is only after the low is established at node 2 that P1 is turned-on very slightly, if at all.

(c) Hence, in the steady state condition of $V_{IN}$ at 2.4 volts N1 and P2 are on hard and N4 is on. P5 is on but in view of its high impedance passes only a very small current via D1 and D2. Transistors N2, P3 and P4 are fully off while P1 is either slightly off or barely on.

(d) When $V_{IN}$ makes a negative-going transition from 2.4 volts to 0.4 volt, N1 turns-off. The voltage (V1) at node 1 goes from $[2.4+2V_F]$ volts to $[0.4+2V_F]$ volts. Assuming $V_{DD}$ to be 5 volts and $V_F$ to be 0.8 volt, P1 now has a $V_{GS}$ of 3.0 volts and is turned-on. Since P1 was either slightly off or barely on prior to the negative going transition of $V_{IN}$, it turns-on very quickly and drives node 2 towards $V_{DD}$. With node 2 driven high the output of inverter I2 goes low turning on P3. P1-ON and the regenerative action of P3 and N2 quickly drive and clamp node 2 to $V_{DD}$ volts. With node 2 at $V_{DD}$, P5 is turned-off. Concurrently, with node 3 driven low, P4 is turned-on and N4 is turned-off.

The turn-on of P4 clamps node 1 to $V_{DD}$ and turns-off P1. But since node 2 is already at $V_{DD}$ and the combination of N2-ON and P3-ON maintains node 2 at $V_{DD}$, P1 can be turned-off. Concurrently, the low at node 3 turns-off N4 and prevents any current flow from node 1 into input terminal 11. This brings the circuit to the condition described in (a) above.

Thus, when $V_{IN}$ makes a "high" to "low" transition, P1 is momentarily turned-on hard to charge node 2 towards $V_{DD}$. Following this, P1 and N1 are turned-off. The result is that in the steady state $V_{IN}$-"low" condition there is very little power dissipation. Also, as already discussed with P1 turned-off, N1 when turned-on will be able to quickly drive node 2 to ground. Thus, following the "high" to "low" transition, the circuit is again ready to respond quickly to a "low" to "high" transition.

In the circuit of FIG. 2 transistors P1 and N1 may be formed with comparable geometries, or can be designed with values optimized for the desired circuit performance. Clearly, since P1 is either OFF or barely ON, when N1 is turned-on P1 need not be made a very high impedance (very small geometry device) in comparison to N1. Since P1 is pulsed on and N1 is turned-off when the output has to go high the ratio of P1 to N1 does not have to be some predetermined value to achieve operability or to define the output level. Furthermore, when one of P1 and N1 is on, the other one is either off or barely on and there is very little power dissipation in the circuit.

In the circuit shown, the input signal is level shifted by means of two diodes (D1 and D2), but it should be evident that, where appropriate, more or fewer diodes may be used. Further, one may substitute for the diodes other suitable level shift elements, that is, elements across which a suitable voltage drop occurs in response to an applied current.

What is claimed is:

1. The combination comprising:
   first and second insulated-gate field-effect transistors (IGFETs) of complementary conductivity type, each IGFET having source and drain electrodes defining the ends of a conduction path, and a control electrode;
   a signal input terminal, a signal output terminal, and first and second power terminals for the application therebetween of an operating potential;
   means connecting the control electrode of said second IGFET to said signal input terminal;
   means connecting the drain electrodes of said first and second IGFETs to said signal output terminal;
   means connecting said source of said first IGFET to said first power terminal;
   means connecting said source of said second IGFET to said second power terminal;
   selectively enabled level shift means coupled between the control electrodes of said second and first IG- FETs for, in response to an input signal at said input terminal having a polarity and magnitude to turn-on said second IGFET, level shifting the input signal level and applying it to the control electrode of said second IGFET in a direction to reduce the forward bias between the control and source electrodes of said first IGFET; and means coupled between the output terminal and the control electrode of said first IGFET for turning-it off a predetermined period after its turn-on in response to an input signal at said input terminal of a polarity and magnitude to turn-off said second IGFET and turn-on said first IGFET.

2. The combination as claimed in claim 1 wherein said means coupled between the output terminal and the control electrode of said first IGFET also includes means for clamping said output terminal to said first power terminal.

3. The combination as claimed in claim 1 wherein said selectively enabled level shift means and said means coupled between the output terminal and the control electrode of said first IGFET include:

third and fourth IGFETs of same conductivity as said first IGFET having their conduction paths connected in parallel between said first power terminal and the control electrode of said first IGFET, a fifth IGFET of same conductivity as said second IGFET having its conduction path connected in series with a level shift element between the control electrodes of said first and second IGFETs;

means coupling said output terminal to the control electrode of said third IGFET; and an inverter connected at its input to said output terminal and at its output to the control electrodes of said fourth and fifth IGFETs.

4. The combination as claimed in claim 3 wherein said means coupled between said output terminal and said control electrode of said first IGFET also includes a sixth IGFET of same conductivity type as said first IGFET having its conduction path connected between said output terminal and said first power terminal and having its control electrode connected to said output of said inverter.

5. The combination as claimed in claim 3 wherein said third IGFET is of smaller geometry than said fourth IGFET.

6. The combination as claimed in claim 3 wherein said level shift element includes N diodes connected in series, where N is an integer equal to or greater than one.

* * * * *